(12) United States Patent
Kim et al.

(10) Patent No.: US 10,236,857 B2
(45) Date of Patent: Mar. 19, 2019

(54) ELASTIC COMPOSITE FILTER

(71) Applicant: JOINSET CO., LTD., Ansan-si, Kyeonggi-do (KR)

(72) Inventors: Sun-Ki Kim, Gunpo-si (KR); Byung-Sun Jung, Ansan-si (KR); Jung-Sup Choi, Ansan-si (KR); Seong-Jin Lee, Ansan-si (KR); Kwang-Hwi Choi, Ansan-si (KR)

(73) Assignee: JOINSET CO., LTD. (KR)

( * ) Notice: Subject to any disclaimer, the term of this patent is extended or adjusted under 35 U.S.C. 154(b) by 92 days.

(21) Appl. No.: 15/260,681

(22) Filed: Sep. 9, 2016

(65) Prior Publication Data

US 2017/0077891 A1    Mar. 16, 2017

(30) Foreign Application Priority Data

Sep. 10, 2015  (KR) .................. 10-2015-0128639
Feb. 6, 2016   (KR) .................. 10-2016-0015335

(51) Int. Cl.
| | |
|---|---|
| *H03H 7/06* | (2006.01) |
| *H01G 4/35* | (2006.01) |
| *H01G 4/40* | (2006.01) |
| *H01G 2/22* | (2006.01) |
| *H01G 4/232* | (2006.01) |
| *H01G 4/255* | (2006.01) |
| *H05K 1/02* | (2006.01) |
| *H03H 1/00* | (2006.01) |

(52) U.S. Cl.
CPC ............... *H03H 7/06* (2013.01); *H01G 2/22* (2013.01); *H01G 4/232* (2013.01); *H01G 4/255* (2013.01); *H01G 4/35* (2013.01); *H01G 4/40* (2013.01); *H05K 1/0231* (2013.01); *H05K 1/0233* (2013.01); *H05K 1/0234* (2013.01); *H05K 1/0237* (2013.01); *H05K 1/0296* (2013.01); *H03H 2001/0021* (2013.01); *H05K 1/0259* (2013.01); *H05K 2201/1006* (2013.01)

(58) Field of Classification Search
CPC ......... H03H 7/1708; H03H 2001/0021; H01G 2/22; H01G 4/232; H01G 4/255; H01G 4/35; H01G 4/40; H05K 1/0231; H05K 1/0233; H05K 1/0234; H05K 1/0237; H05K 1/0296
USPC ........................................... 333/12
See application file for complete search history.

(56) References Cited

FOREIGN PATENT DOCUMENTS

| | | |
|---|---|---|
| JP | 2005-303221 A | 10/2005 |
| KR | 10-2010-0048044 A | 5/2010 |
| KR | 10-1001354 B1 | 12/2010 |
| KR | 10-1381127 B1 | 4/2014 |
| KR | 10-1466589 B1 | 12/2014 |

*Primary Examiner* — Benny T Lee
*Assistant Examiner* — Hafizur Rahman
(74) *Attorney, Agent, or Firm* — Park & Associates IP Law, P.C.

(57) ABSTRACT

Disclosed is a technology that enables an elastic composite filter to have a capacitor to remove noise. The elastic composite includes a functional material layer; electrode patterns disposed on top and bottom surfaces of the material layer, respectively; and a conductive elastic member adhered onto the top electrode pattern, wherein the elastic member is coupled electrically and mechanically to the top electrode pattern to be used as an electrode, and the elastic member is in direct contact with a conductive object to provide elasticity.

17 Claims, 6 Drawing Sheets

110: 111, 112, 113

ELASTIC COMPOSITE FILTER

REFERENCE TO RELATED APPLICATIONS

This application claims the priority benefit of Korean Patent Application No. 10-2015-0128639 filed on Sep. 10, 2015 and Korean Patent Application No. 10-2016-0015335 filed on Feb. 6, 2016, the entire contents of which are incorporated herein by reference.

FIELD OF THE INVENTION

The present invention relates to a composite filter, and more particularly, to a technology allowing to be interposed between conductive objects to be in elastic contact with one of the conductive objects, including functionality, allowing smooth internal discharging and removing noise such as static electricity.

BACKGROUND OF THE INVENTION

An elastic electrical connection terminal is used for electrically connecting a conductive object, such as an antenna or metal casing to the conductive pattern of a circuit board or to the ground in order to remove static electricity or electromagnetic interference (EMI).

The electrical connection terminal may be used in a state in which it is fixed to the conductive pattern of the circuit board through soldering or inserted between objects.

In the case where these electrical connection terminals are used in order to connect electricity in a vertical direction, there are needs for a structure and material that have a little electric resistance, a long working distance in the vertical direction if possible so that it is possible to accept the dimension tolerance of the vertical direction of the electrical connection terminals to be electrically connected, and good elasticity and elastic restoring force.

Examples of such an elastic electrical connection terminal include Korean Patent Nos. 1001354 and 1381127 by this applicant.

However, these electrical connection terminals are interposed between conductive objects and have performed a role in elastically, electrically connecting opposing objects, but have no functions of removing incoming noise.

Typically, the noise includes conduction noise that is propagated through a signal line or power line, induction noise that is propagated through electromagnetic induction or electrostatic induction, and radiation noise that is propagated to the air in the form of electromagnetic waves.

Although it is possible to consider applying a capacitor in order to remove the noise, a typical capacitor is installed at a printed circuit board, is difficult to be installed between conductive objects due to no elasticity, fails to be in elastic contact with a working distance, and runs a high risk of being damaged by external shock.

SUMMARY OF THE INVENTION

An object of the present invention is to provide a composite filter that has elasticity and may prevent or attenuate electric shock or noise by over-current through the ground.

Another object of the present invention is to provide a composite filter that is easy to manufacture and install and has economic feasibility.

Another object of the present invention is to provide a composite filter that has a long working distance and good elasticity and elastic restoration and has no impact on a variation in capacitance even when being pressed by a object.

Another object of the present invention is to provide a composite filter that allows easy surface mounting and allows soldering.

Another object of the present invention is to provide a composite filter that allows easy internal discharging.

According to an aspect of the present invention, there is provided an elastic composite that includes a functional material layer; electrode patterns disposed on top and bottom surfaces of the material layer, respectively; and a conductive elastic member adhered onto the top electrode pattern, wherein the elastic member is coupled electrically and mechanically to the top electrode pattern to be used as an electrode, and the elastic member is in direct contact with a conductive object to provide elasticity.

The electrode pattern may be a metal foil, a plated conductive fiber, a polymer film having a metal layer on an outer surface, or a conductive polymer coated layer.

The material layer may be a dielectric polymer that high dielectric ceramic powder is mixed and cured, or dielectric ceramic that is formed by firing of high dielectric powder.

The dielectric polymer may be any one of silicon rubber, epoxy resin or polyimide resin, and the dielectric ceramic is a ceramic capacitor or a ceramic varistor.

The elastic member may be a) an elastic member that comprises an elastic core comprising a foamed body and a rubber tube, and conductive cloth surrounding the elastic core and adhered thereto, b) an elastic member that comprises the elastic core and a conductive polymer coated layer or metal layer that surrounds the elastic core, c) a metal flat spring or metal coil spring, or d) conductive elastic rubber.

The elastic composite filter may further comprise internal electrodes that are connected directly to the electrode patterns, respectively to allow electricity to flow and that vertically extend in the functional material layer; and an electrostatic discharging part that is disposed between the internal electrodes.

The electrostatic discharging part may comprise an air gap (space) or a semiconductor material layer that enables discharging induction.

The electrostatic discharging part may be in plurality, and internal electrodes that correspond to the electrostatic discharging part may be disposed.

Edges of the electrode patterns may be formed inwards from an edge of the functional material layer to have a pull-back margin, and the composite filter may comprise a via hole that vertically passes through the material layer and the electrode patterns.

The electrode patterns may be bent to inside of the via hole at edges of both entrances of the via hole to extend electrode tips.

A distance between the electrode tips may be formed to be equal to or smaller than a thickness of the material layer.

A predetermined width at an edge of the top electrode pattern may be covered with an insulated coated layer.

An exposed part of the material layer and a predetermined width at an edge of the top electrode pattern may be covered with an insulated coated layer.

The exposed part may comprise top, side and bottom surfaces of the material layer.

The elastic composite filter may further comprise internal electrodes that are electrically connected to the electrode patterns, respectively by the interposing of a via hole and horizontally face to partly overlap inside the material layer.

The composite filter may have a function of preventing electric shock by an air gap between the internal electrodes.

The material layer may be a ceramic chip that comprises a ceramic capacitor and a ceramic varistor.

Solder resist may be disposed at a predetermined width on both edges of the electrode pattern, and a plating layer may be disposed to cover the solder resist and the electrode pattern.

BRIEF DESCRIPTION OF THE DRAWINGS

The above objects and other advantages of the present invention will become more apparent by describing in detail exemplary embodiments thereof with reference to the attached drawings in which.

DETAILED DESCRIPTION OF THE INVENTION

It should be noted that the technical terms used in the present invention are only used in order to describe particular embodiments and are not intended to limit the present invention. Also, unless especially defined as other meanings in the present invention, the technical terms used in the present invention should be construed as meanings generally understood by a person skilled in the art to which the present invention pertains and should not be construed as excessively comprehensive meanings or as excessively narrow meanings. Also, when the technical terms used in the present invention are wrong ones that fail to accurately express the spirit of the present invention, they should be replaced with technical terms with which the skilled person may correctly understand. Also, the general terms used in the present invention should be construed as defined in the dictionary or according to the context and should not be construed as excessively narrow meanings.

Also, the terms in singular form in the present invention include the plural form unless otherwise specified. The term 'comprised of' or 'include' in the present invention should not be construed as necessarily including all of many components or steps set forth in the present invention, and it should be construed that some components or steps may not be included or it is possible to further include additional components or steps.

In the following, particular embodiments of the present invention are described in detail with reference to the accompanying drawings.

Figure 1:
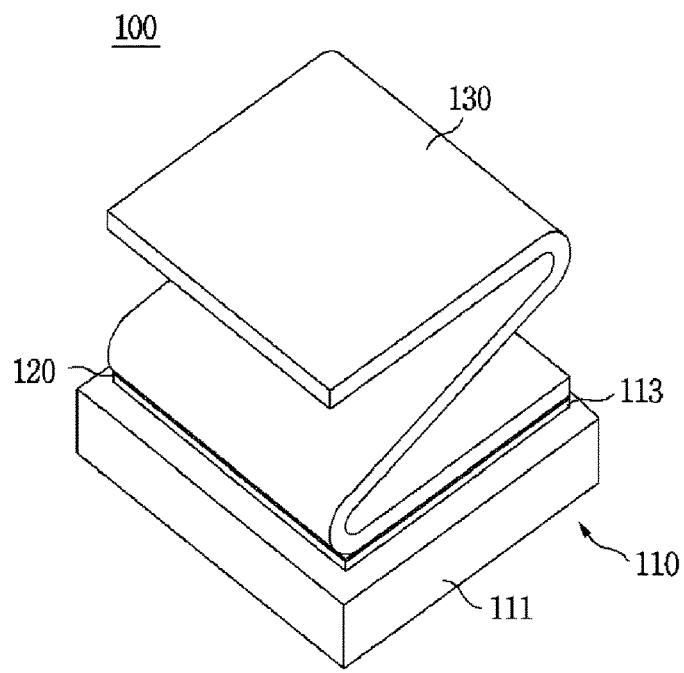
FIG. 1 represents a composite filter according to an embodiment of the present invention.
Figure 2:
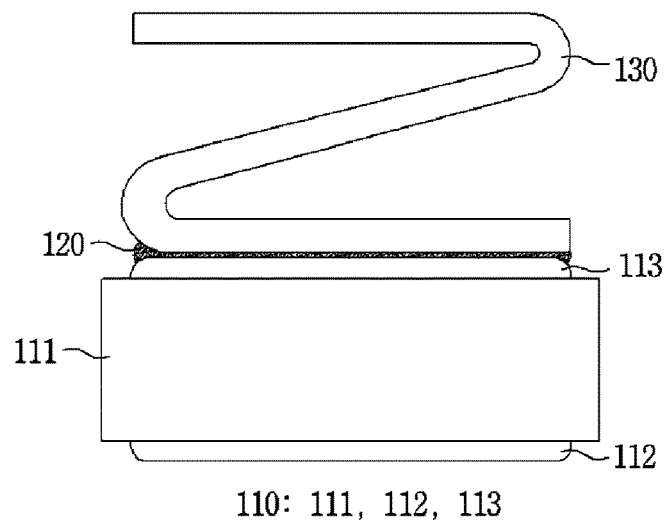
FIG. 2 is a longitudinal-sectional view of the composite filter of FIG. 1.
Figure 3A:
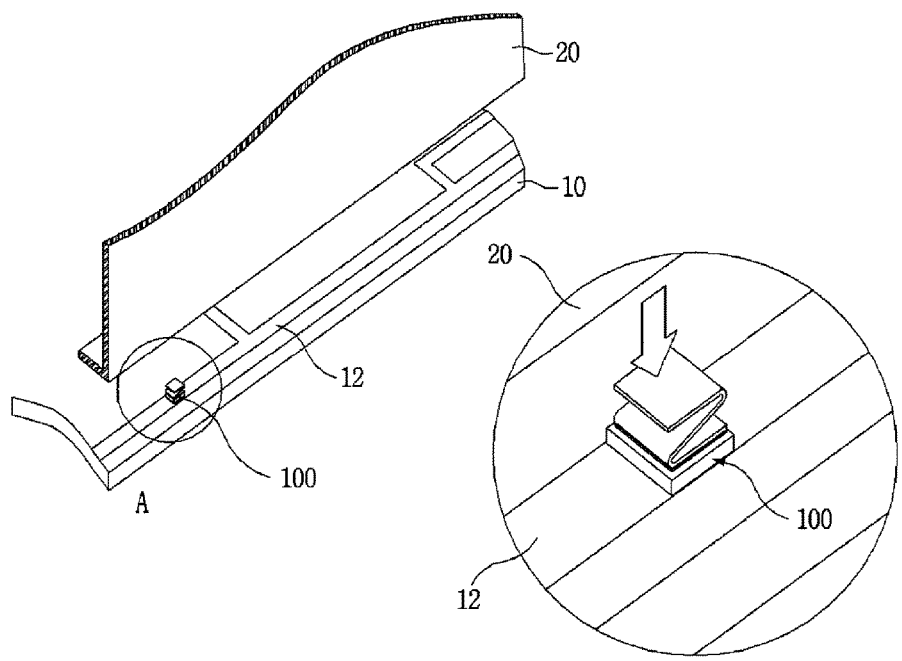
FIG. 3A shows the usage of a composite filter.
Figure 3B:
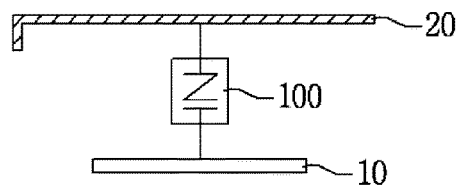
FIG. 3B represents an equivalent circuit.

FIG. 1 represents a composite filter according to an embodiment of the present invention, FIG. 2 is a longitudinal-sectional view of the composite filter of FIG. 1, FIG. 3A shows the usage of a composite filter, and FIG. 3B represents an equivalent circuit.

A composite filter 100 includes a plate-shaped element 110 and a flat spring 130 that is adhered to the plate-shaped element 110 by a conductive adhesive or solder 120 and that is made of a metal material having elasticity.

The plate-shaped element 110 includes a functional material layer 111 and electrode patterns 112 and 113 that are disposed at the top and bottoms surfaces of the functional material layer 111, and the flat spring 130 is mounted on the top electrode pattern 113.

The functional material layer 111 that forms the plate-shaped element 110 may employ dielectric, and a capacitor is used as an example in the present embodiment. The dielectric may include a ceramic material, a ceramic/polymer composite material, and a polymer material.

The bottom electrode pattern 112 and the flat spring 130 each is used as an electrode and forms a capacitor together with the functional material layer 111, and the flat spring 130 is pressed by the pressure of a conductive object, e.g., a metal casing 20.

The edges of the electrode patterns 112 and 113 may be formed inwards from the edge of the functional material layer 111 to have a pull back margin. The distance of the pull back margin is formed to be at least 0.1 mm, and in the case where surface mounting is needed, it may be configured in order to prevent the electric short between the top electrode pattern 113 and the bottom electrode pattern 112.

In the case where the bottom electrode pattern 112 is a metal foil that allows soldering, the composite filter 100 is surface-mounted on the conductive pattern 12 of the circuit board 10 by the vacuum pick up of the flat spring 130 after reel taping, and then adhered by reflow soldering by solder cream, and the compression and restoration of the composite filter 100 are provided by the pressing of the flat spring 130 by the metal casing 20 from the top, as represented in FIG. 3A.

The flat spring 130 means that all the fixed, contact or connected parts form a plate shape and in the present embodiment, the flat spring 130 forms the shape 'Z' when being laterally viewed but is not limited thereto and may form the shape 'C', and a coil type or pressure welding type spring may be applied.

The flat spring 130 is formed as a single piece and it is possible to continuously manufacture, with a press by using a press mold, a metal foil having good elasticity, such as phosphor bronze or copper alloy having a thickness of e.g., 0.05 mm to 0.15 mm.

Here, it is possible to perform a press operation for anti-oxidation and then perform tin, silver or gold plating to manufacture the flat spring 130.

There are advantages in that the top surface of the flat spring 130 forms a plane with a relatively wide area, so it allows easy electrical contact with facing objects having various structures, and electrical contact with a object increases, so an electric resistance decreases. In particular, there are advantages in that an electric contact resistance decreases and reliable mechanical contact is allowed when being in electric contact with an antenna.

Although the size of the bottom surface of the flat spring 130 is not especially limited, it may be the same or similar as the size of the top electrode pattern 113.

As could be seen in the equivalent circuit of FIG. 3B, the flat spring 130 of the composite filter 100 electrically and mechanically couples to the top electrode pattern 113 to be used as one of electrodes of a capacitor, so it performs a role in providing the compression and elastic restoration of the composite filter 100. As such, the flat spring 130 functions as an electrode made of a metal material and having conductivity and elasticity but the relative permittivity of the flat spring 130 is significantly small, so a variation in parasitic capacitance by the flat spring 130 is not significant even when the flat spring 130 having a relatively large height is interposed and pressed between conductive objects and thus the height of the flat spring varies.

Although the dimension of the composite filter 100 is not limited, its width may be e.g., 1 mm to 3 mm, its length may be 1 mm to 10 mm, its height may be about 0.5 mm to 2.0 mm, and the dimension is determined in consideration of capacitance, the space between facing objects or the like.

Capacitance, the capacity of a capacitor that is mostly generated by the bottom electrode pattern 112, the top electrode pattern 113, and the functional material layer 111 interposed therebetween may be, but is not limited to, a value easy to remove noise corresponding to a related frequency, e.g., 2 pF to 50 pF in an LTE band. For example, the capacitance may also be a value that may attenuate undesired noise in order to prevent undesired static electricity or electric shock through the ground.

The pressing rate of the composite filter 100 by the flat spring 130 may be desirably 25% of the original height and elastic restoration after pressing maintains 90% or more.

The electrode patterns 112 and 113 may be metal foils such as copper foils, plated conductive fibers, polymer films having metal layers on the outer surface, or conductive polymer coated layers having a relatively low electric resistance and here, the polymer may include rubber and the polymer coated layer may be e.g., a silicon rubber coated layer.

Also, in the case where the electrode patterns 112 and 113 are the metal foils or the polymer films having the metal layers, hard condition resistant metals, such as tin, silver or nickel and gold may be plated on the metal foils or the metal layers, or conductive polymer resins or conductive silicon rubber having a low electric resistance may be coated thereon to prevent corrosion.

In the same way as the functional material layer 111, the electrode patterns 112 and 113 may be adhered to the functional material layer 111 by the application of a separate adhesive in the case where they are the metal foils, the plated conductive fibers, and the polymer films having the metal layers on the outer surface, in which case a silicon rubber adhesive having elasticity and flexibility may be applied as the adhesive. Also, in the case where the electrode patterns 112 and 113 are the conductive polymer coated layers, they may be integrally adhered to the bottom or top surface of the functional material layer 111 by e.g., casting to be formed as a single piece.

The functional material layer 111 is electric insulation and for example, it may be a dielectric polymer formed by the mixing of a polymer resin with high dielectric ceramic powder that is based on barium titanate (BaTiO3), such as Y5V having relative permittivity of about 18000 (−30° C. to +85° C., capacitance variation within −82% to +22% of capacitance at 25° C.) or X7R having relative permittivity of about 3000 (−55° C. to +125° C., capacitance variation within ±15% of capacitance at 25° C.) and the curing of the mixture, or dielectric ceramic formed by the firing of high dielectric ceramic powder together with varistor.

The dielectric polymer allows easy processing such as the cutting of the blade of a knife because it has flexibility and low hardness, but there is a drawback in that the dielectric polymer has a small capacitance value because it has lower permittivity than fired dielectric ceramic.

Since other parts except for the functional material layer 111 have significantly low permittivity than the functional material layer 111, the capacitance of the composite filter 100 is mostly determined by the permittivity of the functional material layer 111 together with the space between the bottom electrode pattern 112 and the top electrode pattern 113 as will be described.

The capacitance of the composite filter 100 is calculated by the following Equation 1:

<Equation 1>

$$C = \varepsilon_0 \varepsilon_r \frac{S}{d}$$

Where S denotes the facing area of the bottom surface of a spring or a base, d denotes the space between the base and the bottom surface of the spring that level off, $\varepsilon_0$ denotes the permittivity of vacuum 8.85×10−12 F/m, and $\varepsilon_r$ denotes the relative permittivity of a material that forms a dielectric layer.

Thus, the capacitance of the composite filter 100 is in proportion to the areas of the electrode patterns 112 and 113 that are used as electrodes and to the relative permittivity of the functional material layer 111 and is inverse proportion to the space between the electrode patterns 112 and 113.

As represented in FIG. 3A, when the composite filter 100 is soldered and adhered onto the conductive pattern 12 of the circuit board 10, it elastically supports the metal casing 20 by the elasticity of the flat spring 130, high-frequency noise entering through the metal casing 20 is filtered by the capacitance of the composite filter 100 fails to enter the circuit board 10 and likewise, since the thickness of the functional material layer 111 is thin, ESD entering through the metal casing 20 is delivered from the flat spring 130 or the top electrode pattern 113 directly to the bottom electrode pattern 112 through the air adjacent to the side of the functional material layer 111.

Also, since commercial power entering through the conductive pattern 12 of the circuit board 10 is cut off by the capacitance of the composite filter 100 and thus not delivered to the metal casing 20, a function of preventing electric shock is provided.

In the case where the capacitance of the composite filter 100 is set to correspond to another related frequency, e.g., a low frequency, low-frequency noise entering through the flat spring 130 may exit to the ground of the circuit board 10 through the bottom electrode pattern 112.

The meanings of a high frequency and the low frequency that are used in the present invention are relative concepts that may be defined according to the use of the composite filter 100 and in the case of e.g., a smart phone, the high frequency means approximately 30 MHz or more and the low frequency may be assumed as 1 kHz or less but they are not limited thereto.

Thus, since noise to be removed or suppressed varies depending on the size of the capacitance of the composite filter 100, it is possible to set the capacitance in consideration of the frequency and size of the noise to be removed.

The tolerance of the capacitance of the composite filter 100, i.e., a variation in the capacitance of the composite filter 100 between when the composite filter 100 is most strongly pressed and when it is most weakly pressed is desirably within ±10% but not limited thereto.

In the case where the composite filter 100 is pressed between the metal casing 20 and the circuit board 10, the flat spring 130 is compressed but the space between the top electrode pattern 113 and the bottom electrode pattern 112 does not vary, so as a result, a variation in the capacitance of the composite filter 100 is not significant as in Equation 1 above.

Although the composite filter 100 is desirably fixed to a conductive object by a double-sided conductive adhesive tape or soldering, the embodiment is not limited thereto and the composite filter may also be inserted and used between conductive objects.

Here, for the soldering, the functional material layer 111 needs to have a heat-resisting property so that it is possible to satisfy a soldering condition by solder cream.

Figure 4:
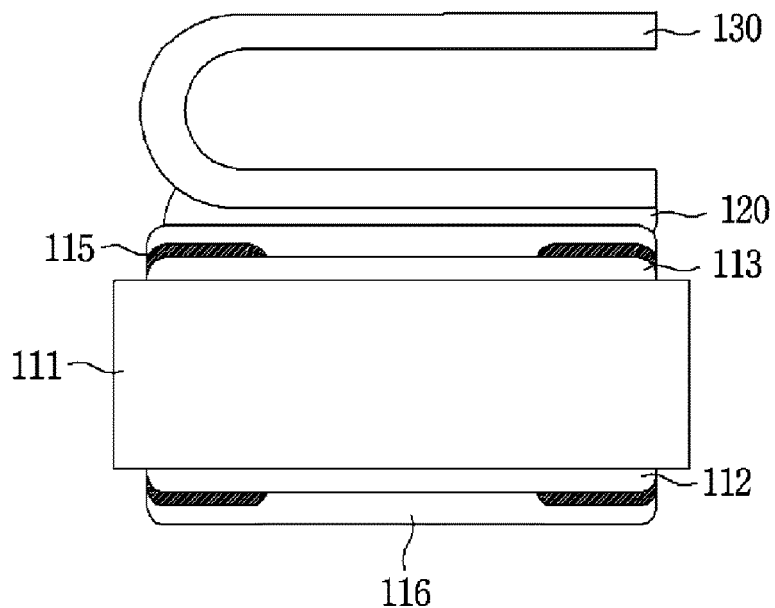
FIG. 4 represents a composite filter according to another embodiment of the present invention.

FIG. 4 represents a composite filter according to another embodiment of the present invention.

According to the present embodiment, solder resist 115 is disposed at a predetermined width on both edges of the top and bottom electrode patterns 112 and 113, and a plating layer 116 is disposed to cover the solder resist 115 and the electrode patterns 112 and 113.

The flat spring 132 having a C-shaped section is adhered onto the plating layer 116, with the solder 120 therebetween.

When pressure is typically applied to the flat spring 130 or 132, the pressure may not be evenly applied to all parts thereof or the flat spring 130 or 132 may operate as a lever due to the shape itself of the flat spring 130 or 132, in which case one edge of the top electrode pattern 113 may be separated from the functional material layer 111. As a result, there is a limitation in that capacitance varies in the case of a capacitor though depending on the type of the functional material layer.

According to the present embodiment, by interposing the solder resist 115 containing a lot of glass ingredients between the plating layer 116 and the top electrode pattern 113 on both edges of the plating layer 116 that is in direct contact with the flat spring 132, there is a gap between the solder resist 115 and the top electrode pattern 113 in one direction even when the flat spring 132 operates as the lever, so it is possible to protect the top electrode pattern 113.

Also, the plating layer 116 is disposed to cover both the top electrode pattern 113 and the bottom electrode pattern 112, so it is possible to enhance adhesive strength.

Figure 5:
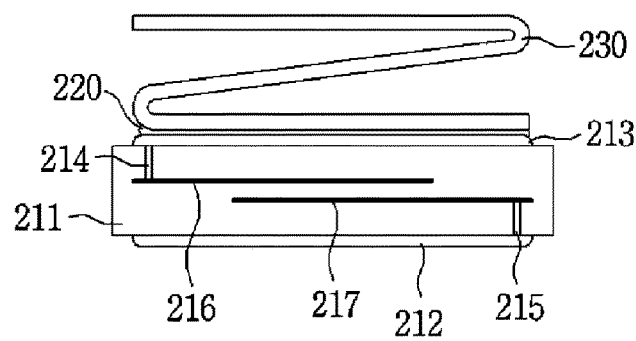
FIG. 5 is a longitudinal-sectional view of a composite filter according to another embodiment of the present invention.

FIG. 5 is a longitudinal-sectional view of a composite filter according to another embodiment of the present invention.

Electrode patterns 212 and 213 are disposed on the top and bottom surfaces of a functional material layer 211, respectively and a conductive metal flat spring 230 is adhered onto the top electrode pattern 213 by the interposing of solder 220 or conductive adhesive to form the composite filter 200.

The functional material layer 211 may be a dielectric polymer or dielectric ceramic as described above and in the present embodiment, a ceramic chip is used as the functional material layer 211.

According to the present embodiment, internal electrodes 216 and 217 that partly overlap each other are disposed in the ceramic chip 211, and the internal electrodes 216 and 217 are electrically connected to the electrode patterns 212 and 213 through via holes 214 and 215, respectively.

The ceramic chip 211 may be a ceramic varistor or ceramic capacitor and have a function of preventing electric shock by the air gap between the internal electrodes 216 and 217.

According to such a structure, by narrowing a gap between the internal electrodes 216 and 217, it is possible to increase the whole capacitance of the composite filter 200 and it is possible to secure the thickness of the ceramic chip 211 to ensure predetermined strength.

In other words, there is a need to decrease the distance between electrodes in order to increase the capacitance of the composite filter as described above, but although there is an advantage in the case where a dielectric layer is a dielectric ceramic, there is a limitation because the dielectric layer is broken by external shock when making thickness thin. However, according to the present embodiment, by using a ceramic chip element as the dielectric layer, it is possible to solve such a limitation and sufficiently enjoy the advantage of the dielectric ceramic as the dielectric layer.

It is possible to perform soldering on the circuit board by using the bottom electrode pattern 212 of the ceramic chip 211, but the embodiment is not limited thereto and it is possible to interpose a double-sided conductive adhesive tape that electricity flows in a thickness direction, to adhere to e.g., the metal casing functioning as the ground.

Figure 6A:
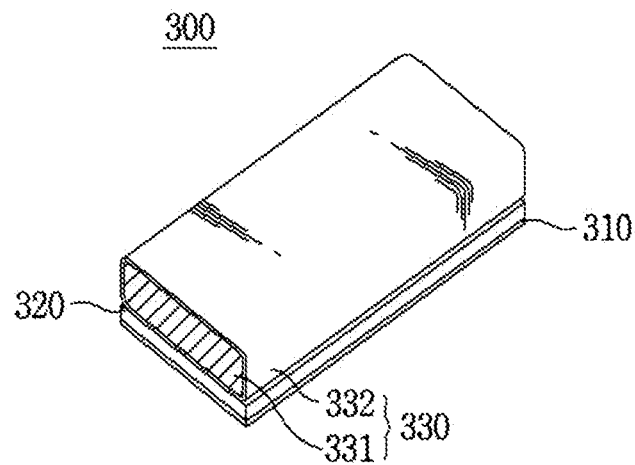
FIGS. 6A and 6B represent composite filters according to other embodiments of the present invention, respectively.
Figure 6B:
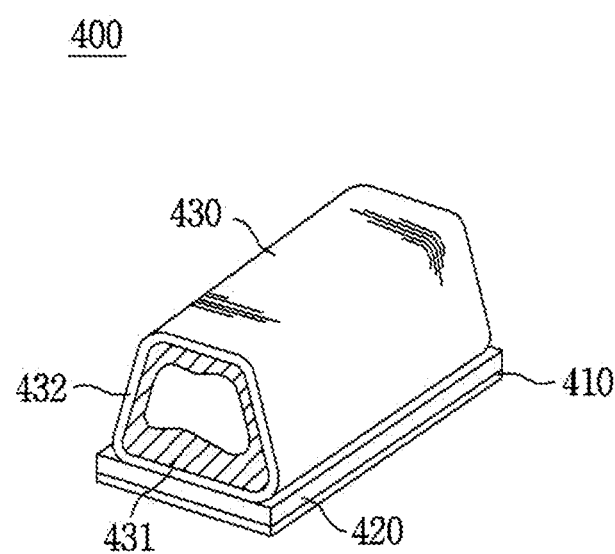

FIGS. 6A and 6B represent composite filters according to other embodiments of the present invention, respectively.

Referring to FIG. 6A, a conductive elastic member 330 that forms a composite filter 300 may include an elastic core 331 that includes rubber, and a conductive sheet 332 that surrounds the elastic core 331 and is adhered thereto.

Here, the conductive sheet 332 may be conductive cloth or a conductive heat-resistant polymer film. A metal layer is integrally formed on the hidden surface of the film or a metal foil is adhered to the hidden surface. Although the polymer film may also be used as a dielectric, there is no significant meaning because the permittivity of the polymer film is smaller than that of a dielectric layer 320.

A conductive or dielectric rubber tube may be used as the elastic core 331 and provides the compression and elastic restoration of the composite filter 300, and the conductive sheet 332 that surrounds the elastic core 331 is used as one of electrodes of a capacitor.

Referring to FIG. 6B, an elastic member 430 includes a core 431 that has at least one through hole therein in a length direction, and a conductive rubber layer or polymer coated layer 432 that surrounds the outer surface of the core 431.

Figure 7:
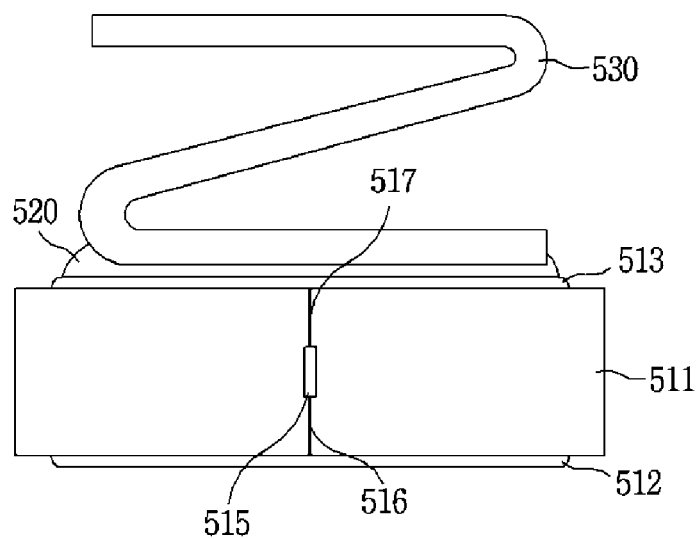
FIG. 7 represents a composite filter according to another embodiment of the present invention.

FIG. 7 represents a composite filter according to another embodiment of the present invention.

Electrode patterns 512 and 513 are disposed on the top and bottom surfaces of a functional material layer 511, respectively and the inside of the functional material layer includes internal electrodes 516 and 517 that are connected directly to the electrode patterns 512 and 513, respectively to allow electricity to flow and that vertically extend in the functional material layer 511, and a electrostatic discharging part 515 disposed between the internal electrodes 516 and 517.

The electrostatic discharging part 515 provides an electrostatic discharging path and may be an air gap (space) or a semiconductor material layer that enables discharging induction.

The electrostatic discharging part 515 may be in plurality, and internal electrodes 516 and 517 that correspond to the electrostatic discharging part 515 may be disposed.

The composite filter 500 may be installed at a printed circuit board by surface mounting by a vacuum pick up and reflow soldering.

In the present embodiment as well, the edges of the electrode patterns 512 and 513 may be formed inwards from the edge of the functional material layer 511 to have a pull back margin and in the case where surface mounting is needed, it is possible to prevent the electric short between the top electrode pattern 513 and the bottom electrode pattern 512, as described above.

The functional material layer 511 may be any one of all kinds of dielectrics having permittivity and semiconductor of which the resistance varies according to a variation in voltage, current, or temperature and in the case where it has a dielectric property with respect to a predetermined voltage, it is possible to implement a function of protecting from electric shock because external power supply may be cut off.

As described above, the function of cutting off the external power supply of the functional material layer 511 may be managed by the evaluating of the property of withstanding voltage per unit thickness of the functional material layer.

Also, since the internal electrodes 516 and 517 are disposed perpendicularly to the top and bottom electrode patterns 512 and 513 and the electrostatic discharging part 515 is disposed the internal electrodes, it is possible to secure a sufficient thickness corresponding to an electrostatic destruction path in a horizontal direction.

Also, since the internal electrodes 516 and 517 are electrically connected directly to the top and bottom electrode patterns 512 and 513, there is no need to form a via hole for an intermediate electrode and fill metal paste as ever and as a result, a manufacturing process is simple and a manufacturing cost decreases.

Figure 8:
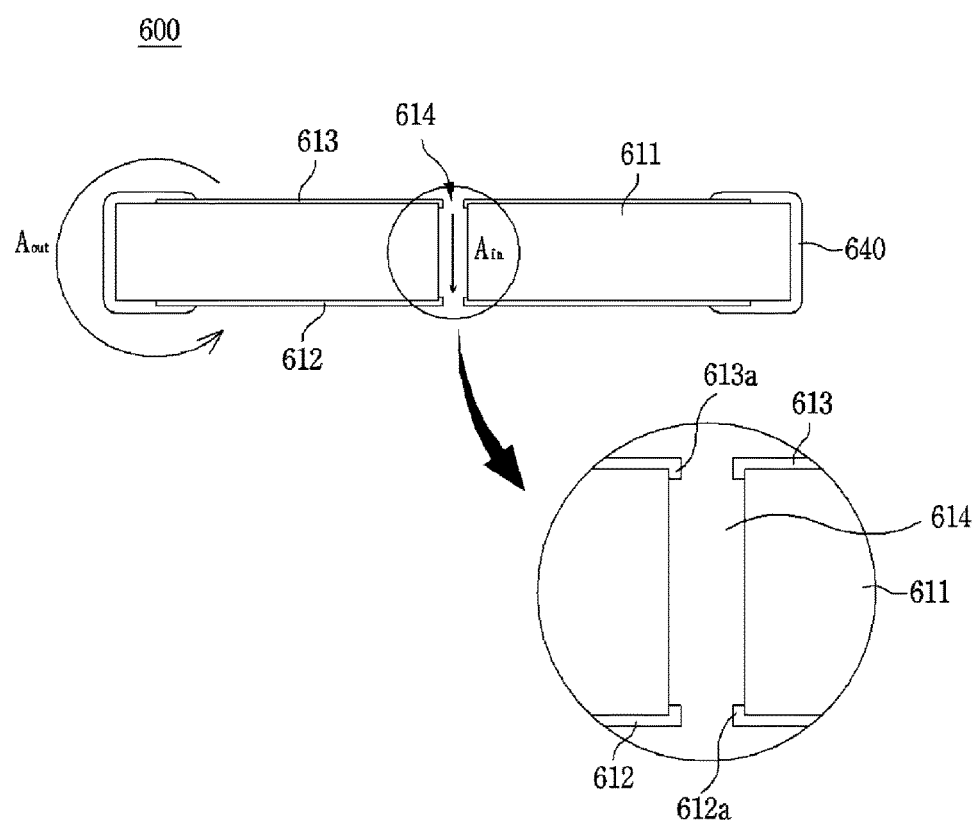
FIG. 8 represents a composite filter according to another embodiment of the present invention.

FIG. 8 represents a composite filter according to another embodiment of the present invention.

A composite filter 600 includes a functional material layer 611, electrode patterns 612 and 613 that are disposed on the top and bottom surfaces of the functional material layer 611, respectively and a via hole 614 that vertically passes through the functional material layer 611 and the electrode patterns 612 and 613. A flat spring that is adhered to the top electrode pattern 613 by the interposing of solder is omitted for convenience sake.

In the present embodiment, the electrode patterns 612 and 613 are bent to the inside of the via hole 614 at the edges of the via hole 614 to extend electrode tips 612a and 613a.

The via hole 614 may be formed by laser processing or mold punching, and the electrode tips 612a and 613a may be disposed by the printing of liquefied metal paste on the electrode patterns 612 and 613.

According to such a structure, the electrode tips 122 and 132 that are extended to the inside of the via hole 614 formed inside the functional material layer 611 have a structure in which they vertically face by using the via hole 612 as a space.

In the case where static electricity enters from a flat spring through the top electrode pattern 613, the static electricity is changed to light energy while it is delivered from the electrode tip 613a of the top electrode pattern 613 to the electrode tip 612a of the bottom electrode pattern 612 and at this point, the via hole 614 provides one kind of discharging path.

It is important that the distance between the electrode tip 613a of the top electrode pattern 613 and the electrode tip 612a of the bottom electrode pattern 612 is formed to be equal to or smaller than the thickness of the functional material layer 611. This is a design condition for leading the electrostatic discharging path to the inner via hole 614 of a plate-shaped element, and the distance between the top electrode tip 613a and the bottom electrode tip 612a is desirably formed to be 95% or less of the thickness of the functional material layer 611.

As represented in FIG. 8, a discharging path formed in the functional material layer 611 includes an internal discharging path Ain and an external discharging path Aout and in the embodiment above, since an internal discharging resistance is smaller than an external discharging resistance, internal discharging through the internal discharging path mostly occurs and thus it is possible to have a high electrostatic discharging resistance function.

Here, e.g., a pull back margin is secured as a way of increasing the external discharging resistance in addition to a way of decreasing the internal discharging resistance but there is a limitation in the dimension of the pull back margin.

However, the external discharging resistance varies according to temperature, humidity and a usage environment and is affected by nearby parts that are mounted.

Thus, as shown in FIG. 8, it is possible to increase an external discharging resistance by a coated layer 640 that covers the functional material layer 611 and the edges of the top and bottom electrode patterns 612 and 613.

That is, the coated layer 640 is disposed over all the exposed parts of the functional material layer 611 and over a predetermined width at the edges of the top electrode pattern 613 and the and bottom electrode pattern 612 and as a result, only the top electrode pattern 613 and the bottom electrode pattern 612 are exposed to the outside.

Here, the coated layer 640 may not be disposed on the bottom electrode pattern 612 in consideration of soldering.

According to such a structure, since an external discharging distance increases by the coated layer 640 and an external discharging resistance thus increases, external discharging Aout may be easy to occur and internal discharging Ain may more easily occur.

The coated layer 640 may be disposed by heat treatment after dipping with e.g., dielectric glass paste but the embodiment is not limited thereto.

The coated layer 640 may desirably be a dielectric layer but is not limited thereto.

Although in the present embodiment, disposing the coated layer 640 at the exposed part of the functional material layer 611 is provided as an example, it is possible to obtain the same effect even when the coated layer 640 is disposed to cover only a predetermined width at the edge of the top electrode pattern 613, without limitation to the above-described structure as long as a manufacturing method may secure efficiency.

Although in the embodiments above, the composite filter which is interposed between the metal casing and the circuit board and in which one of objects is used as the ground is used in order to remove static electricity, surge or noise, the embodiment is not limited thereto and it is also possible to be applied to a wearable device including a smart watch or to smart shoes.

According to the configuration as described above, the composite filter may include elasticity providing a long working distance and capacitance suitable to remove noise to remove incoming or outgoing noise while being in elastic contact with facing conductive targets.

Also, it is inserted between conductive targets for use or is easy to install at one of facing conductive targets by a double-sided conductive adhesive tape through which electricity passes or by soldering.

Also, it is possible to adjust the height of a leaf spring, an elastic member to easily adjust a working distance and the composite filter has good elasticity and elastic restoration by a metal material.

Also, since there is no variation in the distance between two electrodes even when the composite filter is pressed by a target, there is no impact on a variation in the capacitance of the composite filter.

Also, it is possible to prevent or attenuate, through the ground, electric shock or noise by over-current entering by a capacitor forming a functional material layer.

Also, when static electricity enters from the outside through an elastic member, the static electricity is attenuated through the process of being converted into light energy through a discharging path interposed in the functional material layer.

Also, it is possible to cause easier internal discharging by increasing an external discharging resistance with an increase in an external discharging distance by an insulated coated layer or shortening an internal discharging path by an electrode tip that is extended to the inside of a via hole.

A person skilled in the art would be able to modify and change the above-described content without departing from the spirit and scope of the present invention. Thus, the embodiments disclosed in the present invention are not to limit but to describe the technical spirit of the present invention, and the scope of the technical spirit of the present invention is not limited by these embodiments. The protective scope of the present invention should be construed by the following claims, and all the technical spirits within the equivalent scope should be construed as being included in the scope of a right of the present invention.

What is claimed is:

1. An elastic composite filter configured to be elastically mounted to an electrically conductive object, the elastic composite filter comprising:
   a functional material layer;
   electrode patterns disposed on top and bottom surfaces of the functional material layer, respectively; and
   a conductive elastic member affixed to the top electrode pattern,
   wherein the elastic composite filter is in direct contact with the electrically conductive object to provide an electrical connection there between,
   wherein the elastic member includes any one of:
   a) an elastic core including a foamed body and a rubber tube, and conductive cloth surrounding the elastic core and adhered thereto,
   b) an elastic core and a conductive polymer coated layer or metal layer that surrounds the elastic core,
   c) a metal flat spring, or
   d) conductive elastic rubber.

2. The elastic composite filter of claim 1, wherein each of the top electrode pattern and the bottom electrode pattern is formed of a metal material, a plated conductive fiber, a polymer film having a metal layer on an outer surface, or a conductive polymer coated layer.

3. The elastic composite filter of claim 1, wherein the functional material layer is formed of a dielectric polymer mixed with high dielectric constant ceramic powder, or dielectric ceramic formed by firing high dielectric constant powder.

4. The elastic composite filter of claim 3, wherein the dielectric polymer is any one of silicon rubber, epoxy resin or polyimide resin, and the dielectric ceramic is a ceramic capacitor or a ceramic varistor.

5. The elastic composite filter of claim 1, wherein solder resist is disposed at a predetermined width on both edges of the electrode pattern, and a plating layer is disposed to cover the solder resist and the electrode pattern.

6. The elastic composite filter of claim 1, further comprising: internal electrodes that are connected directly to the electrode patterns, respectively to allow electricity to flow and that vertically extend in the functional material layer; and at least one electrostatic discharging part disposed between the internal electrodes.

7. The elastic composite filter of claim 6, wherein the at least one electrostatic discharging part comprises an air gap or a semiconductor material layer that enables discharging induction.

8. The elastic composite filter of claim 6, wherein the at least one electrostatic discharging part is provided in plurality, and the internal electrodes are disposed corresponding to the electrostatic discharging parts.

9. The elastic composite filter of claim 1, wherein edges of the electrode patterns are formed inwards from an edge of the functional material layer to have a pull back margin, and the composite filter comprises a via hole that vertically passes through the functional material layer and the electrode patterns.

10. The elastic composite filter of claim 9, wherein the electrode patterns are bent to inside of the via hole at edges of both entrances of the via hole to form extended electrode tips.

11. The elastic composite filter of claim 10, wherein a distance between the electrode tips is formed to be equal to or smaller than a thickness of the functional material layer.

12. The elastic composite filter of claim 1, wherein a predetermined width at an edge of the top electrode pattern is covered with an insulated coat layer.

13. The elastic composite filter of claim 1, wherein an exposed part of the functional material layer and a predetermined width at an edge of the top electrode pattern are covered with an insulated coat layer.

14. The elastic composite filter of claim 13, wherein the exposed part comprises the top and bottom surfaces and a plurality of side surfaces of the functional material layer.

15. The elastic composite filter of claim 1, further comprising internal electrodes that are electrically connected to the electrode patterns, respectively by the interposing of a via hole and horizontally face to partly overlap inside the functional material layer.

16. The elastic composite filter of claim 15, wherein the composite filter has a function of preventing electric shock between the internal electrodes.

17. The elastic composite filter of claim 15, wherein the functional material layer is a ceramic chip that comprises a ceramic capacitor and a ceramic varistor.

* * * * *